United States Patent
Wu et al.

(10) Patent No.: US 12,538,739 B2
(45) Date of Patent: Jan. 27, 2026

(54) POST CMP CLEANING APPARATUS AND POST CMP CLEANING METHODS

(71) Applicants: Chen-Hao Wu, Hsinchu (TW); Chu-An Lee, Hsinchu (TW); Chun-Hung Liao, Taichung (TW); Shen-Nan Lee, Jhudong Township, Hsinchu County (TW); Teng-Chun Tsai, Hsinchu (TW); Huang-Lin Chao, Hillsboro, OR (US); Chih-Hung Chen, Hsinchu (TW)

(72) Inventors: Chen-Hao Wu, Hsinchu (TW); Chu-An Lee, Hsinchu (TW); Chun-Hung Liao, Taichung (TW); Shen-Nan Lee, Jhudong Township, Hsinchu County (TW); Teng-Chun Tsai, Hsinchu (TW); Huang-Lin Chao, Hillsboro, OR (US); Chih-Hung Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 290 days.

(21) Appl. No.: 16/353,029

(22) Filed: Mar. 14, 2019

(65) Prior Publication Data
US 2020/0294821 A1    Sep. 17, 2020

(51) Int. Cl.
*H01L 21/67* (2006.01)
*B08B 1/12* (2024.01)
(Continued)

(52) U.S. Cl.
CPC .......... *H01L 21/67219* (2013.01); *B08B 1/12* (2024.01); *B08B 1/20* (2024.01);
(Continued)

(58) Field of Classification Search
CPC ......... H01L 21/67046; H01L 21/02057; H01L 21/67051; H01L 21/67092;
(Continued)

(56) References Cited

U.S. PATENT DOCUMENTS 6,036,785 A * 3/2000 Ferrell ...................... B08B 3/12
134/28
2004/0221473 A1* 11/2004 Lauerhaas .......... G01N 33/6893
34/255

(Continued)

*Primary Examiner* — Douglas Lee
(74) *Attorney, Agent, or Firm* — McClure, Qualey & Rodack, LLP

(57) ABSTRACT

A post CMP cleaning apparatus is provided. The post CMP cleaning apparatus includes a cleaning stage. The post CMP cleaning apparatus also includes a rotating platen disposed in the cleaning stage, and the rotating platen is configured to hold and rotate a semiconductor wafer. The post CMP cleaning apparatus further includes a vibrating device disposed over the rotating platen. The post CMP cleaning apparatus further includes a solution delivery module disposed near the vibrating device and configured to deliver a cleaning fluid to the semiconductor wafer. The vibrating device is configured to provide the cleaning fluid with a specific frequency which is at least greater than 100 MHz while the rotating platen is rotating the semiconductor wafer, so that particles on the semiconductor wafer are removed by the cleaning fluid.

20 Claims, 6 Drawing Sheets

(51) Int. Cl.

| | | |
|---|---|---|
| *B08B 1/20* | (2024.01) | |
| *B08B 1/34* | (2024.01) | |
| *B08B 3/02* | (2006.01) | |
| *B08B 3/04* | (2006.01) | |
| *B08B 3/08* | (2006.01) | |
| *B08B 3/10* | (2006.01) | |
| *H01L 21/02* | (2006.01) | |
| *H01L 21/687* | (2006.01) | |

(52) U.S. Cl.
CPC .............. *B08B 3/022* (2013.01); *B08B 3/041* (2013.01); *B08B 3/08* (2013.01); *B08B 3/102* (2013.01); *H01L 21/02057* (2013.01); *H01L 21/67046* (2013.01); *H01L 21/67051* (2013.01); *H01L 21/67092* (2013.01); *H01L 21/68714* (2013.01); *B08B 1/34* (2024.01)

(58) Field of Classification Search
CPC ..... H01L 21/68714; B08B 1/002; B08B 1/02; B08B 3/022; B08B 3/041; B08B 3/08; B08B 3/102

See application file for complete search history.

(56) References Cited

U.S. PATENT DOCUMENTS

| | | | |
|---|---|---|---|
| 2005/0161059 A1* | 7/2005 | Franklin | B08B 3/12 134/1 |
| 2011/0155169 A1* | 6/2011 | Holsteyns | H01L 21/67051 134/1 |
| 2012/0024313 A1* | 2/2012 | Rastegar | H01L 21/02041 134/1 |
| 2012/0273363 A1* | 11/2012 | Holsteyns | H01L 21/02052 438/746 |
| 2013/0008462 A1* | 1/2013 | Beck | H01L 21/67051 134/1.3 |
| 2014/0216508 A1* | 8/2014 | Korbler | B06B 1/0607 310/334 |
| 2018/0071794 A1* | 3/2018 | Wang | B06B 3/02 |

* cited by examiner

POST CMP CLEANING APPARATUS AND POST CMP CLEANING METHODS

BACKGROUND

Chemical Mechanical Polishing (CMP) processes are widely used in the fabrication of integrated circuits. When an integrated circuit is built up layer by layer on the surface of a semiconductor wafer, CMP processes are used to planarize the topmost layer to provide a planar surface for subsequent steps in the fabrication process. CMP processes are carried out by polishing the wafer surface against a polishing pad. A slurry containing both abrasive particles and reactive chemicals is applied to the polishing pad. The relative movement of the polishing pad and the wafer surface coupled with the reactive chemicals in the slurry allows the CMP process to planarize or polish the wafer surface by means of both physical and chemical forces.

After a CMP process, the polished wafer surface is cleaned to remove CMP residue, such as organic matter and abrasive slurry particles, in order that the surface be made ready for subsequent photolithography processes and other steps in the fabrication process. In conventional post-CMP cleaning processes, brushes are used to remove the residue on the polished wafers. The brushes are typically formed of sponges.

Although existing apparatuses and methods for a post-CMP cleaning process have been generally adequate for their intended purposes, they have not been entirely satisfactory in all respects. Consequently, it is desirable that a solution for performing a post-CMP cleaning process be provided.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
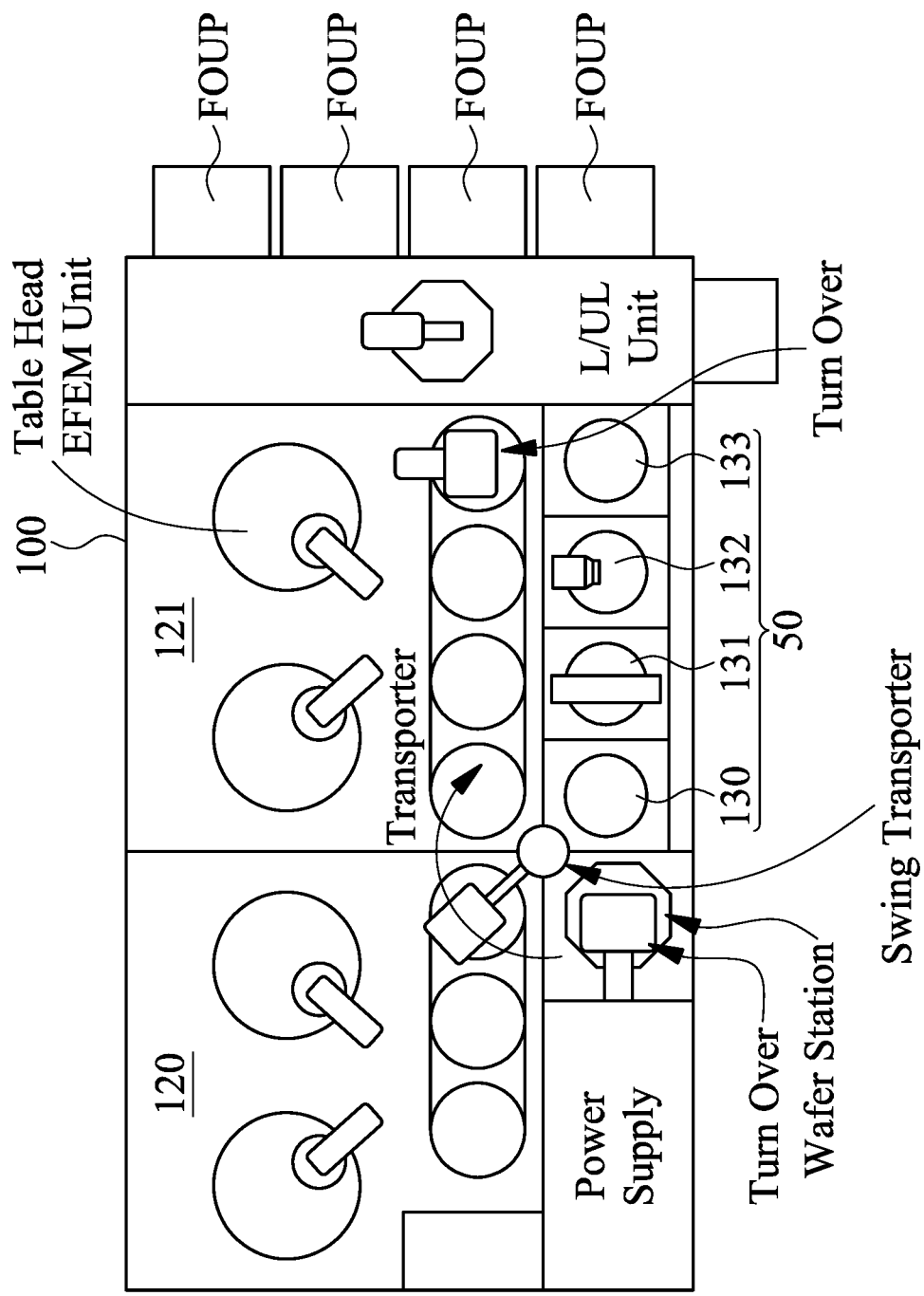
FIG. 1 illustrates simplified representations of various components of a CMP system 100 according to various aspects of the present disclosure.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The present disclosure is generally related to a post CMP cleaning apparatus and post CMP cleaning methods. More particularly, it is related to a post CMP cleaning apparatus and post CMP cleaning methods for effectively removing the particles with different sizes, so that the clean efficiency can be effectively enhanced. One challenge in existing post CMP cleaning apparatus is that the reattachment of small particles to the surfaces of the semiconductor wafer using a cleaning procedure in a contact manner. An object of embodiments of the present disclosure is to maximize the clean efficiency for different sizes of particles.

FIG. 1 illustrates simplified representations of various components of a CMP system 100 according to various aspects of the present disclosure. The CMP system 100 is configured to polish and clean one or more wafers.

The CMP system 100 includes an equipment front end module (EFEM) unit. The EFEM unit may include a plurality of front opening unified pods (FOUP) and a load/unload (L/UL) unit. The EFEM unit loads wafers into the CMP system 100 and unloads the wafers out from the CMP system 100.

The CMP system 100 also includes a polishing unit. The polishing unit may include one or more polishing chambers, for example polishing chambers 120 and 121. Each of the polishing chambers 120 and 121 may include tools such as polishing tables, polishing heads, platens, slurry delivery systems, pad conditioners, etc., for polishing one or more wafers.

In some embodiments, multiple wafers may be polished simultaneously. The polishing chambers 120 may also include transporters or swing transporters for transporting the wafers to and from the polishing chambers, as well as turn over wafer stations (or just turn over tools) for turning over (or flipping) the wafer (so as to polish an opposite side of the wafer). Thus, the polishing target of the polishing chambers 120 and 121 may also include a front side of wafers, a back side of wafers, as well as wafer edges.

In various embodiments, the wafers may be a patterned wafer or a non-patterned wafer, may contain a semiconductor material (e.g., Si or SiGe), an epitaxially grown material, a conductive material (e.g., metal), a glass material, and/or a dielectric material. The polishing processes performed by the polishing chambers 120 and 121 may be utilized in semiconductor fabrication (e.g., planar semiconductor devices or FinFET devices), light-emitting diode (LED) manufacture, liquid-crystal display (LCD) manufacture, solar device manufacture, and/or wafer packaging processes such as wafer bumping, as non-limiting examples.

The CMP system 100 also includes a post CMP cleaning apparatus 50. The post CMP cleaning apparatus 50 may include a plurality of cleaning chambers, for example cleaning chambers 130, 131, 132, and 133. Each of the cleaning chambers 130 to 133 may include tools for cleaning and/or rinsing the wafers, for example after the wafers have been partially or completely polished. The cleaning chambers 130 to 133 may apply a liquid such as de-ionized wafer (DIW) and/or a solution to the polished wafer surface to wash away debris or other byproducts generated as a part of the wafer polishing.

In some embodiments, additional chemicals may be added to the DIW to facilitate the rinsing or cleaning of the wafer. Some of the cleaning chambers (such as the cleaning chamber 131) may also include one or more sponges that may be used to scrub the wafer surface, so as to facilitate the removal of the debris/byproduct without damaging the wafer surface. After the wafers are cleaned by the cleaning chambers 130 to 133, they may still be transported back to the polishing chambers 120 to 121 for further polishing, depending on control instructions received from a controller.

Figure 2:
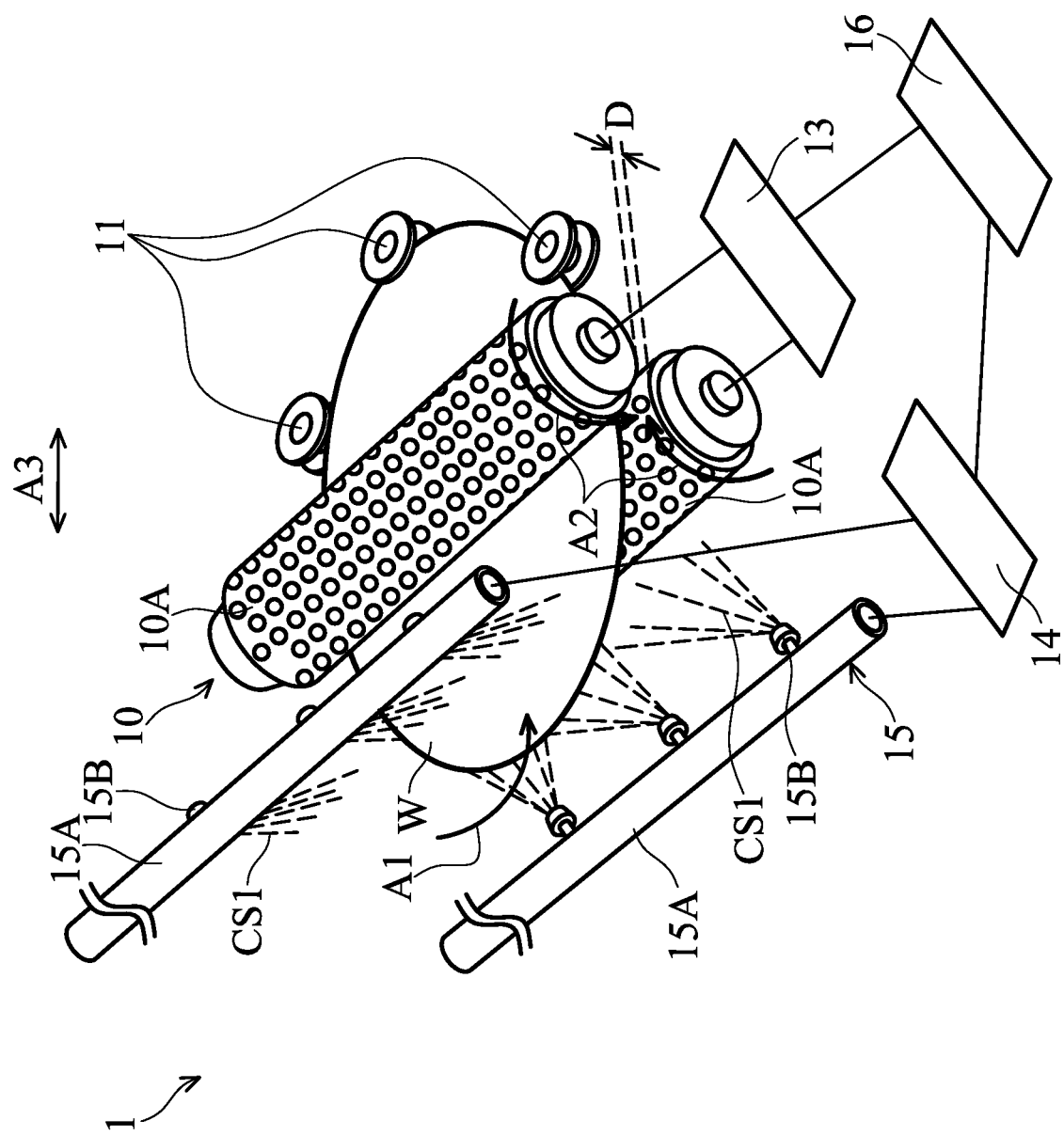
FIG. 2 schematically illustrates a perspective view of a part of a post-CMP cleaning apparatus in accordance with some embodiments of the present disclosure.

FIG. 2 schematically illustrates a perspective view of a part of a post-CMP cleaning apparatus 50 in accordance with some embodiments of the present disclosure. The post-CMP cleaning apparatus 50 may include one or more cleaning chambers (cleaning stages) in FIG. 1 and may be used to clean a semiconductor wafer W after a CMP process. More specifically, the post-CMP cleaning apparatus 50 may be used to perform a post-CMP cleaning to remove CMP residue, such as organic matter and abrasive slurry particles, from both surfaces (including the polished wafer surface and backside surface) of the semiconductor wafer W, in order that the surfaces be made ready for subsequent steps in the fabrication process. The semiconductor wafer W may be a production wafer or a test wafer made of silicon or other semiconductor materials.

As shown in FIG. 2, a cleaning stage 1 of the post-CMP cleaning apparatus 50 includes a cleaner 10 including a pair of brush rollers 10A for performing a scrubbing process onto both surfaces of the polished semiconductor wafer W. During the scrubbing process, the semiconductor wafer W is supported by several rollers 11 (a rotating mechanism) in a horizontal orientation in a cleaning chamber (see FIG. 1) which encloses the brush cleaner 10, and is rotatable by the rollers 11 as the arrow A1 indicated in FIG. 2.

In this embodiment, the cleaner 10 includes the pair of brush rollers 10A, but it is not limited thereto. For example, the brush cleaner 10 may also include a soft pad or a cleaning rod.

The brush rollers 10A may, for example, be porous and/or sponge like, and/or may be made of a resilient material such as polyvinyl acetate (PVA). During the scrubbing process, each brush roller 10A is rotatably (as the arrow A2 indicated in FIG. 1) mounted on the respective spindle (not shown), and the two brush rollers 10A may be driven by a drive mechanism 13 (for example a motor) or mechanisms to move horizontally (as the double-headed arrow A3 indicated in FIG. 2) along the diameter direction of the semiconductor wafer W and rotate/scrub over both surfaces of the semiconductor wafer W. Also, the vertical space D between the two brush rollers 10A, related to the scrubbing force applied to the semiconductor wafer W, is adjustable by moving the brush rollers 10A via the drive mechanism 13.

The cleaning stage 1 also includes a fluid delivery unit 14 for delivering a cleaning solution CS1 to the semiconductor wafer W via a spray unit 15. The cleaning solution CS1 may aid the scrubbing process performed by the cleaner 10 by washing the CMP residue from the brush rollers 10A and/or the surfaces of the semiconductor wafer W.

The cleaning solution CS1 may include various types, wherein different types of the cleaning solution CS1 may be used to clean different CMP residue on the semiconductor wafer W. In accordance with some embodiments, the cleaning solution CS1 includes water with no chemicals intentionally added. The cleaning solution CS1 may also be deionized water. In alternative embodiments, the cleaning solution CS1 includes an acid aqueous solution, which may include an organic acid such as citric acid, an inorganic acid such as $HNO_3$, or the like. In yet alternative embodiments, the cleaning solution CS1 includes an alkaline aqueous solution, which may include an organic base such as NR3 (with R being alkyl), an inorganic base such as $NH_4OH$, or the like. Surfactants such as sodium dodecyl sulfate may also be added into the cleaning solution CS1 to reduce the surface tension thereof. The cleaning solution CS1 may include water as a solvent. Alternatively, the cleaning solution CS1 may use organic solvents such as methanol. The cleaning solution CS1 may also be an aqueous solution including peroxide. For example, the cleaning solution CS1 may include $H_2O_2$ in water.

As shown in FIG. 2, the spray unit 15 includes a pair of spray bars 15A fluidly connected to the fluid delivery unit 14. The two spray bars 15A are respectively adjacent to both sides of the semiconductor wafer W. Several nozzles 15B are mounted on each spray bar 15A for spraying the cleaning solution CS1 onto the semiconductor wafer W. Although not shown, during the scrubbing process, the two spray bars 15A may be driven by a drive mechanism (for example a motor) or mechanisms to rotate (to predetermined orientations) so that the cleaning solution CS1 is accurately directed to both surfaces of the semiconductor wafer W via the nozzles 15B. The spray bars 15A may comprise a metal material (such as stainless steel). The nozzles 15B may comprise ceramics, quartz, or any other anti-corrosive materials (such as plastic).

As shown in FIG. 2, the cleaning stage 1 also includes a controller 16, and the controller 16 may be a computer system. In one example, the computer system includes a processor and a system memory component. In accordance with embodiments of the present disclosure, the computer system performs specific operations via a processor executing one or more sequences of one or more instructions contained in a system memory component.

The processor may include a digital signal processor (DSP), a microcontroller (MCU), and a central processing unit (CPU). The system memory component may include a random access memory (RAM) or another dynamic storage device or read only memory (ROM) or other static storage devices, for storing data and/or instructions to be executed by the processor.

In this embodiment, the controller 16 is coupled to the fluid delivery unit 14 and the drive mechanism 13 and configured to control their operation. For example, the controller 16 may comprise a microprocessor, and the microprocessor may be programmed to active and/or control the fluid delivery unit 14 so as to deliver the cleaning solution CS1 to the spray unit 15 at predetermined times and/or rates, and/or for a predetermined length of time.

Similarly, the microprocessor of the controller 16 may be programmed to active and/or control the drive mechanism 13 so as to move and/or rotate the brush rollers 10A of the cleaner 10 at predetermined times and/or rates, and/or for a predetermined length of time. Although not shown, the controller 16 may also be coupled to the rollers 11 and exert similar control over the rotation of the semiconductor wafer W.

As the procedure of removing the CMP residue from the surfaces of the semiconductor wafer W in the cleaning stage 1 during the scrubbing process, some particles (the CMP residue) having big size (such as over 300 nm) may be removed, and some particle having small size may be still adhered to the semiconductor wafer W. In addition, the CMP residue may be adhered to and build up on the porous surface of the brush rollers 10A, which eventually contaminates the brush rollers 10A and render them ineffective. In some situations, the CMP residue accumulated on the brush rollers 10A is likely to re-adhere to the semiconductor wafer W, resulting in lower cleaning quality of the post-CMP cleaning process. As a result, in order to enhance the cleaning quality of the post-CMP cleaning process, a non-contact cleaning stage is provided as the following description.

Figure 3:
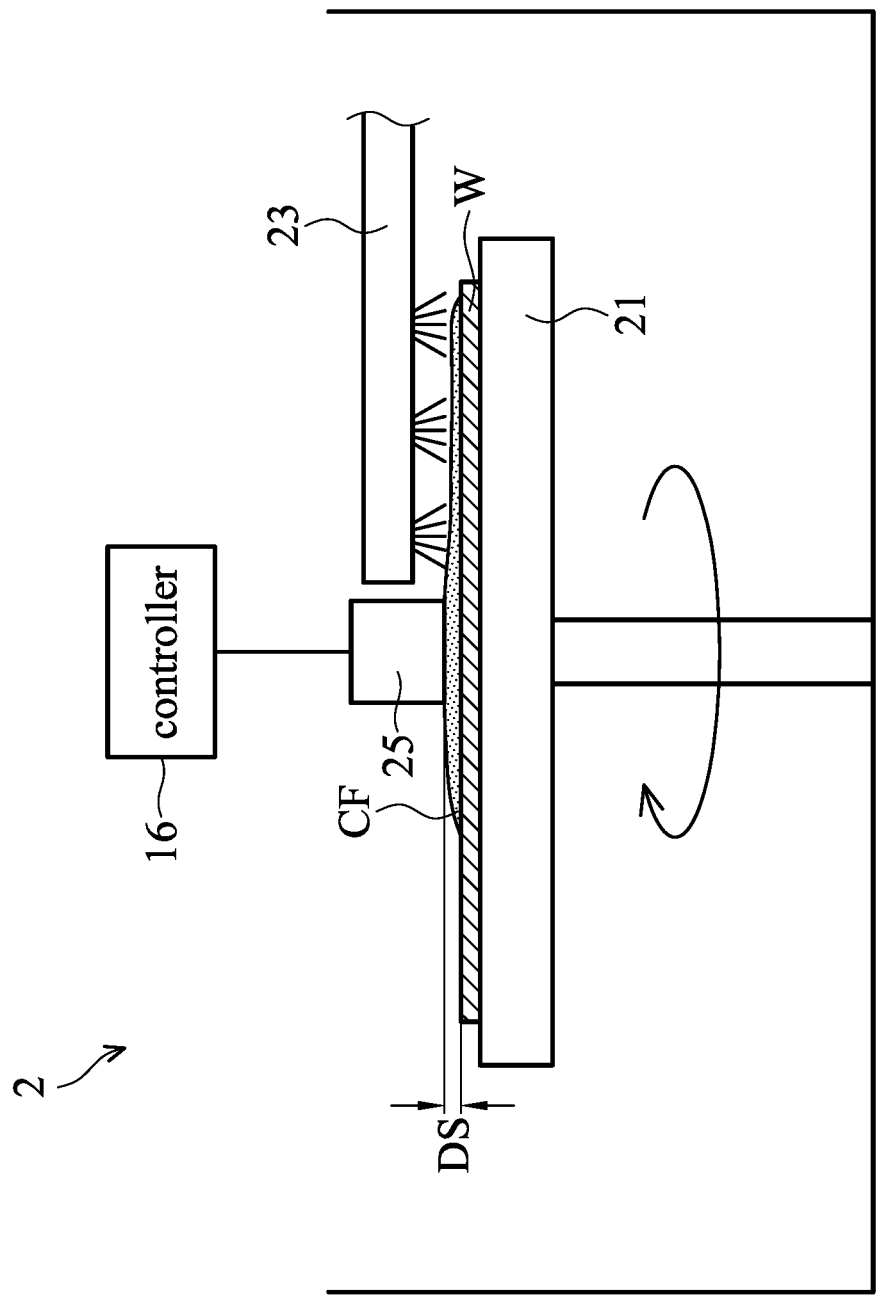
FIG. 3 is a diagram of a cleaning stage of the post CMP cleaning apparatus according to some embodiments of the present disclosure.
Figure 4:
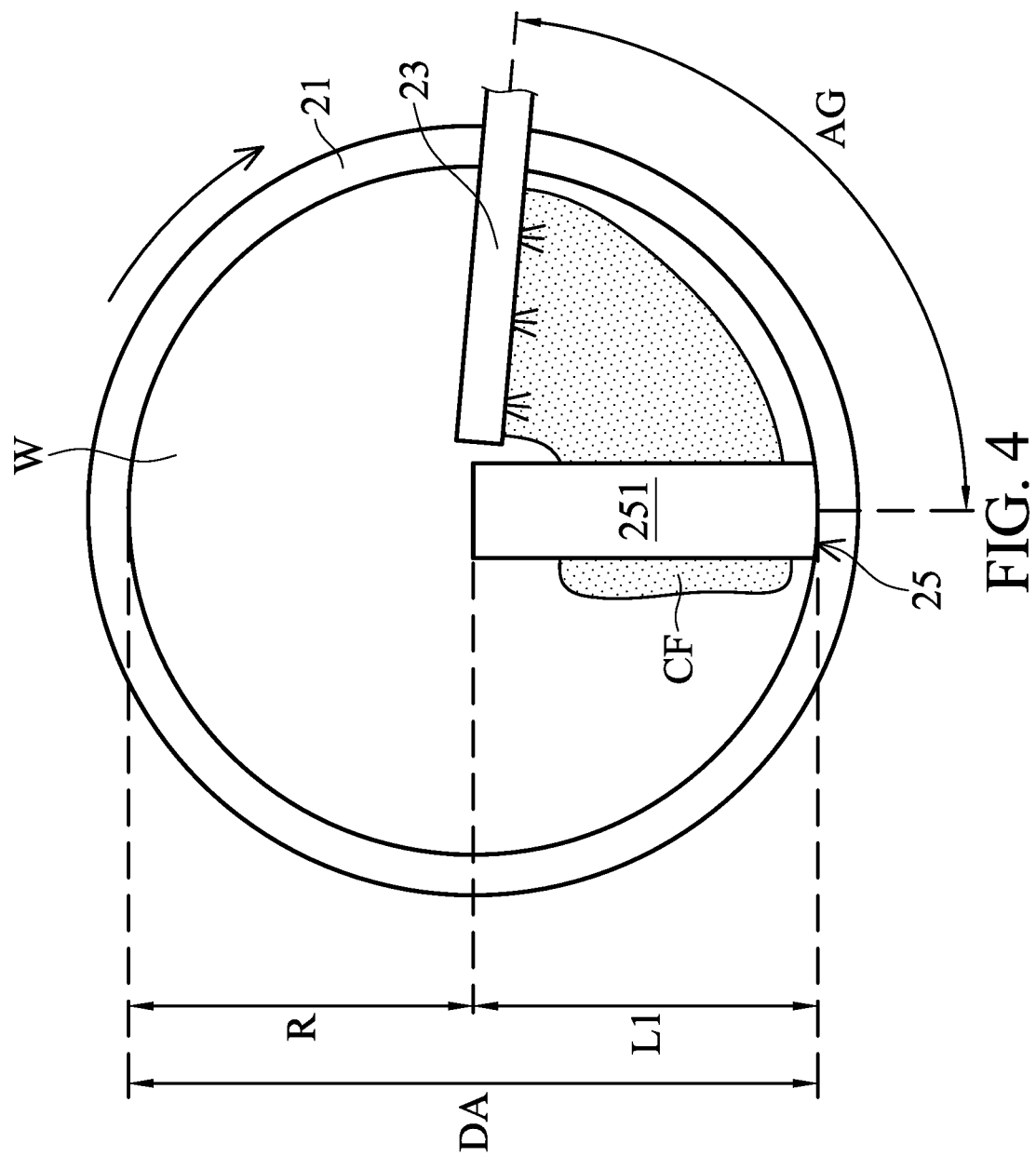
FIG. 4 is a top view of the cleaning stage according to some embodiments of the present disclosure.

Please refer to FIG. 3 and FIG. 4. FIG. 3 is a diagram of a cleaning stage 2 of the post CMP cleaning apparatus 50 in FIG. 1 according to some embodiments of the present disclosure. FIG. 4 is a top view of the cleaning stage 2 according to some embodiments of the present disclosure.

As shown in FIG. 3, the post CMP cleaning apparatus 50 may include the cleaning stage 2, a rotating platen 21, a solution delivery module 23 and a vibrating device 25. The rotating platen 21 is disposed in the cleaning stage 2, and the rotating platen 21 is configured to hold and rotate the semiconductor wafer W. The vibrating device 25 is disposed over the rotating platen 21, and the solution delivery module 23 is disposed near the vibrating device 25 and is configured to deliver a cleaning fluid CF to the semiconductor wafer W.

The vibrating device 25 is configured to provide the cleaning fluid CF with a specific frequency. For example, the specific frequency may be greater than 100 MHz while the rotating platen 21 rotating the semiconductor wafer W, so that particles (residue) on the semiconductor wafer W are removed by the cleaning fluid CF.

In some embodiments, the vibrating device 25 includes two or more transducers, and the controller 16 is configured to control the vibrating device 25 to generate different frequencies using different transducers. For example, the vibrating device 25 may include three transducers, and the three transducers may respectively generate a first frequency, a second frequency and a third frequency. In some embodiments, the second frequency is greater than the third frequency, and the third frequency is greater than the first frequency. In addition, for example, the first frequency ranges from 0.1 MHz to 10 MHz, the third frequency ranges from 10 MHz to 100 MHz, and the second frequency is higher than 100 MHz. For example, the second frequency may range from 100 MHz to 100 GHz.

As shown in FIG. 4, the vibrating device 25 includes a long strip-shaped housing 251, and a length L1 of the long strip-shaped housing 251 is substantially equal to a radius R of the semiconductor wafer W, but it is not limited thereto. For example, in other embodiments, a length of the long strip-shaped housing 251 of the vibrating device 25 may be substantially equal to a diameter DA of the semiconductor wafer W.

In addition, as shown in FIG. 4, an angle AG formed between the vibrating device 25 and the solution delivery module 23 is less than 90 degrees, so as to make it easier for the cleaning fluid CF to flow under the vibrating device 25.

As shown in FIG. 3, it should be noted that the cleaning fluid CF is provided between the vibrating device 25 and the semiconductor wafer W. In some embodiments, the vibrating device 25 may be in contact with the cleaning fluid CF so as to provide the cleaning fluid CF with a specific frequency, and a space DS is formed between the vibrating device 25 and the semiconductor wafer W. For example, the space DS is equal to or less than 1 cm.

In addition, the composition of the cleaning fluid CF may be similar to the cleaning solution CS1, and the concentration of the cleaning fluid CF is lower than concentration of the cleaning solution CS1. In some embodiments, the cleaning fluid CF also includes DI water. In some embodiments, the cleaning fluid CF may include DI water and dissolved gases, such as $H_2$, $N_2$, $CO_2$, $O_3$, Ar and He. In some embodiments, chemicals (such as DHF, $NH_4OH$, $H_2O_2$, SC1, SC2, SPM) can also be included in the cleaning fluid CF.

Figure 6:
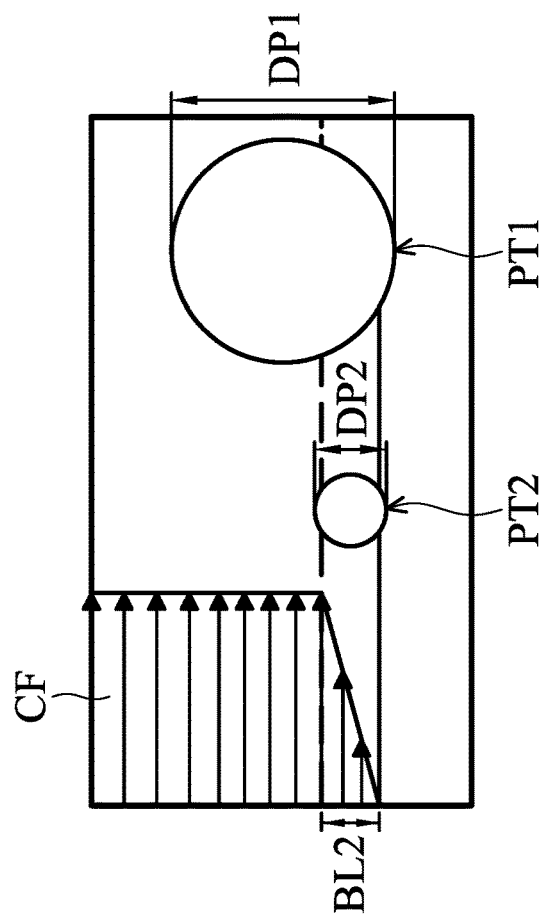
FIG. 5 and FIG. 6 are diagrams of a boundary layer resulting from different frequencies according to some embodiments of the present disclosure.
Figure 5:
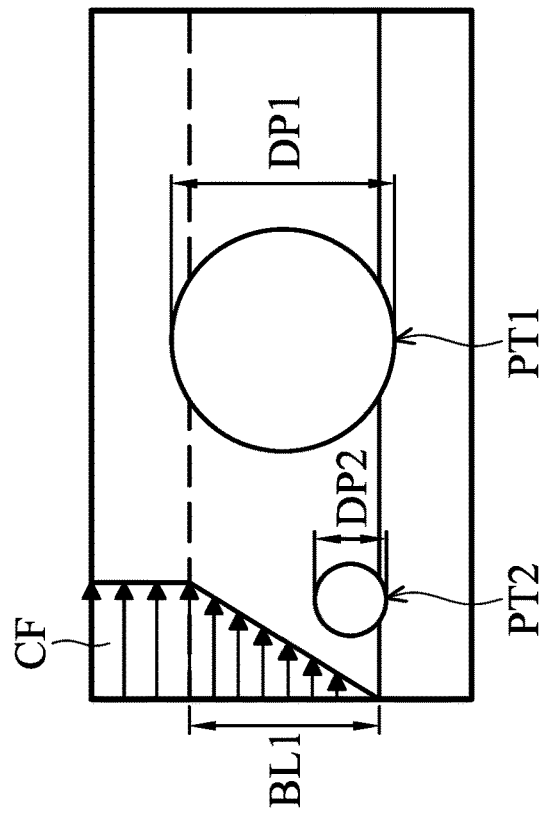

Please refer to FIG. 5 and FIG. 6. FIG. 5 and FIG. 6 are diagrams of a boundary layer resulting from different frequencies according to some embodiments of the present disclosure. In some embodiments, when the vibrating device 25 provides the cleaning fluid CF with different frequencies, a boundary layer resulting from the cleaning fluid CF may be changed.

For example, as shown in FIG. 5, the frequency provided by the vibrating device 25 is about 10 MHz, and the acoustic streaming is illustrated by the arrows in FIG. 5. In this embodiment, a boundary layer BL1 resulting from the cleaning fluid CF is on the semiconductor wafer W. In addition, a first particle PT1 and a second particle PT2 is adhered to the surface of the semiconductor wafer W. The first particle PT1 has a diameter DP1, the second particle PT2 has a diameter DP2, and the diameter DP1 is greater than diameter DP2.

In this situation, the cleaning fluid CF will provide a drag force through the acoustic streaming to the first particle PT1 and the second particle PT2. As shown in FIG. 5, since the boundary layer BL1 is smaller than the diameter DP1, the acoustic streaming of the cleaning fluid CF can provide sufficient drag force to the first Particle PT1. That is, the drag force provided by the cleaning fluid CF is greater than an adhesion force between the first particle PT1 and the semiconductor wafer W.

However, the drag force provided by the acoustic streaming of the cleaning fluid CF at this time is not sufficient to drag the second particle PT2. That is, the drag force provided by the cleaning fluid CF is smaller than an adhesion force between the second particle PT2 and the semiconductor wafer W. In this embodiment, the diameter DP1 ranges from 50 to 130 nm, and the diameter DP2 may be smaller than 30 nm.

In order to remove the second particle PT2, as shown in FIG. 6, the frequency provided by the vibrating device 25 may be modified to be over 100 MHz, and a boundary layer BL2 resulting from the cleaning fluid CF is on the semiconductor wafer W. In this embodiment, the boundary layer BL2 is smaller than the boundary layer BL1 and is also smaller than the diameter DP2 of the second particle PT2 and than the diameter DP1 of the first particle PT1. Therefore, the drag force provided by the acoustic streaming of the cleaning fluid CF is greater than the adhesion force between the second particle PT2 and the semiconductor wafer W and the adhesion force between the first particle PT1 and the semiconductor wafer W. That is, the acoustic streaming of the cleaning fluid CF can provide sufficient drag force to the first particle PT1 and the second particle PT2, so as to remove the first particle PT1 and the second particle PT2 from the semiconductor wafer W.

A table 200 shown below is exemplary relations between the frequency, the boundary layer and the streaming velocity of the cleaning fluid CF. When the frequency provided to the cleaning fluid CF increases, the boundary layer becomes smaller, and the streaming velocity becomes greater, so as to provide sufficient drag force to the particles on the semiconductor wafer W. In addition, the intensity is proportional to streaming velocity.

TABLE 200

| Frequency (MHz) | Boundary Layer Thickness (nm) | Streaming Velocity (m/s) |
| --- | --- | --- |
| 0.1 | 1356 | 2.07E−07 |
| 0.2 | 959 | 8.28E−07 |
| 1 | 429 | 2.07E−05 |
| 10 | 136 | 2.07E−03 |
| 20 | 96 | 8.28E−03 |
| 30 | 78 | 1.86E−02 |
| 50 | 61 | 5.18E−02 |
| 100 | 43 | 0.2 |
| 250 | 27 | 1.3 |
| 300 | 25 | 1.9 |
| 380 | 22 | 3.0 |
| 400 | 21 | 3.3 |
| 500 | 19 | 5.2 |
| 1000 | 14 | 20.7 |

Figure 7:
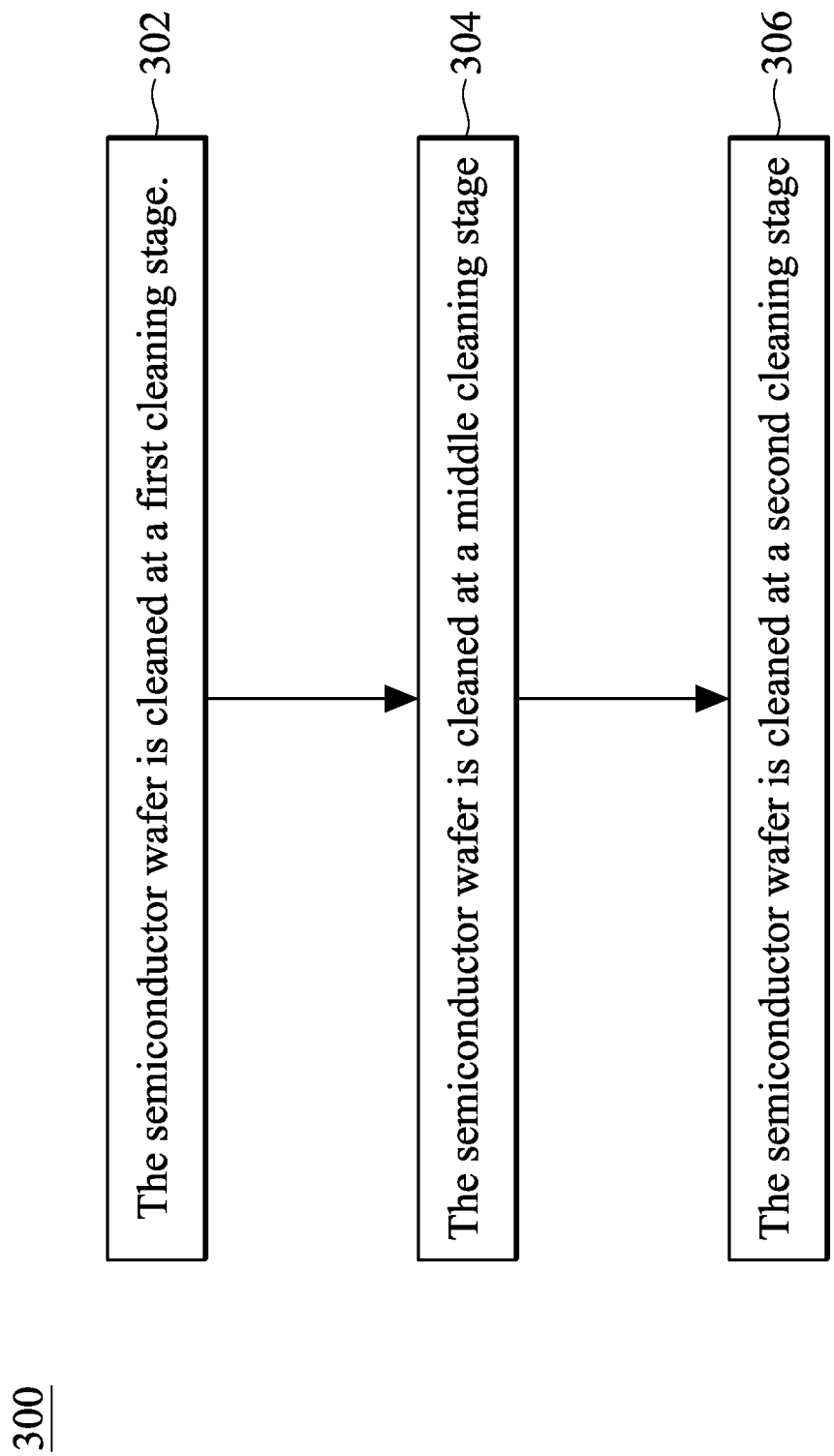
FIG. 7 is a flowchart of a post CMP cleaning method according to some embodiments of the present disclosure.

Please refer to FIG. 7, which is a flowchart of a post CMP cleaning method 300 according to some embodiments of the present disclosure.

The method 300 includes operation 302, in which the semiconductor wafer W is cleaned at a first cleaning stage. In some embodiments, the first cleaning stage may be the cleaning stage 1, and the semiconductor wafer W can be cleaned in a contact manner.

For example, as shown in FIG. 2, the semiconductor wafer W is disposed at the cleaning stage 1 and is supported by the rollers 11, and then the semiconductor wafer W is rotated by the rollers 11. Then, the cleaning solution CS1 is provided to surfaces of the semiconductor wafer W by the fluid delivery unit 14. After that, the brush cleaner (including two brush rollers 10A) is provided to scrub the surfaces of the semiconductor wafer W, so that some particles having a large diameter (for example, over 80 nm) on the semiconductor wafer W can be removed.

In some embodiments, the first cleaning stage may be the cleaning stage 2, and the semiconductor wafer W can be cleaned in a non-contact manner. For example, as shown in FIG. 3 and FIG. 4, the semiconductor wafer W is disposed at the cleaning stage 2, and then the semiconductor wafer W is held and rotated by a first rotating platen (such as the rotating platen 21) in the cleaning stage 2. Then, the cleaning fluid CF is provided to a surface of the semiconductor wafer W by the solution delivery module 23.

After that, the controller 16 controls the vibrating device 25 to provide the cleaning fluid CF with a first frequency while rotating the semiconductor wafer W, so that some particles on the semiconductor wafer W are removed by the cleaning fluid CF. In this embodiment, the first frequency may range from 0.1 MHz to 10 MHz.

The method 300 also includes operation 304 in which the semiconductor wafer W is cleaned at a middle cleaning stage in a contact manner or a non-contact manner after the cleaning procedure of cleaning the semiconductor wafer W at the first cleaning stage.

For example, after the cleaning procedure in the first cleaning stage (the cleaning stage 1 or the cleaning stage 2), the semiconductor wafer W is transported to the middle cleaning stage. In this embodiment, the middle cleaning stage may be another stage which is similar to the cleaning stage 2. The semiconductor wafer W is rotated by a middle rotating platen (similar to the rotating platen 21) in the middle cleaning stage. The controller 16 may control the vibrating device 25 to provide the cleaning fluid CF with another frequency (a third frequency) while rotating the semiconductor wafer W, so that particles having a medium diameter (such as 50~130 nm) can be removed by the cleaning fluid CF. In this situation, the third frequency may range from 10 to 100 MHz and is greater than the first frequency.

For example, in some embodiments, after the cleaning procedure in the first cleaning stage (the cleaning stage 1 or the cleaning stage 2), the semiconductor wafer W is transported to the middle cleaning stage and the middle cleaning stage is similar to the cleaning stage 1. The semiconductor wafer W is supported and rotated by another rotating mechanism (similar to the rollers 11) in the middle cleaning stage. Then, the cleaning solution CS1 is provided to surfaces of the semiconductor wafer W by the fluid delivery unit 14. After that, a cleaner (similar to the brush rollers 10A) is provided to contact the surface of the semiconductor wafer W, so that the particles having a medium diameter can be removed by the cleaner.

The method 300 also includes operation 306 in which the semiconductor wafer W is cleaned at a second cleaning stage. After the cleaning procedure of cleaning the semiconductor wafer W at the middle cleaning stage in a contact manner or a non-contact manner, the semiconductor wafer W is transported to the second cleaning stage, and the second cleaning stage is similar to the cleaning stage 2.

At the second cleaning stage, the semiconductor wafer W is rotated by a second rotating platen (similar to the rotating platen 21) in the second cleaning stage while providing the cleaning fluid CF to the surface of the semiconductor wafer W. Then, the controller 16 may control the vibrating device 25 to provide the cleaning fluid CF with frequency (a second frequency) while rotating the semiconductor wafer W, so that some particles having a small diameter (such as being smaller than 30 nm) on the semiconductor wafer W can be removed by the cleaning fluid CF. In this embodiment, the second frequency may be greater than 100 MHz, for example, it may range from 100 MHz to 100 GHz.

In this embodiment, the second frequency is greater than the first frequency, the second frequency is greater than the third frequency, and the third frequency is greater than the first frequency.

Embodiments of the present disclosure can provide a post CMP cleaning apparatus and post CMP cleaning methods for cleaning particles (the CMP residue). The post CMP cleaning apparatus may include at least one cleaning stage for cleaning the semiconductor wafer W in a contact manner. In addition, the post CMP cleaning apparatus may also include at least one cleaning stage for cleaning the semiconductor wafer W in a non-contact manner.

The two or more cleaning stages are cascade in sequence, to remove the particles with different sizes, so as to effectively remove the particles with different sizes. Therefore, based on the design of the post CMP cleaning apparatus and the post CMP cleaning methods of the present disclosure, the clean efficiency can be effectively enhanced.

In accordance with some embodiments, a post CMP cleaning apparatus is provided. The post CMP cleaning apparatus includes a cleaning stage. The post CMP cleaning apparatus also includes a rotating platen disposed in the cleaning stage, and the rotating platen is configured to hold and rotate a semiconductor wafer. The post CMP cleaning apparatus further includes a vibrating device disposed over the rotating platen. The post CMP cleaning apparatus further includes a solution delivery module disposed near the vibrating device and configured to deliver a cleaning fluid to the semiconductor wafer. The vibrating device is configured to provide the cleaning fluid with a specific frequency which is at least greater than 100 MHz while the rotating platen is rotating the semiconductor wafer, so that particles on the semiconductor wafer are removed by the cleaning fluid.

In accordance with some embodiments, a post CMP cleaning method is provided. The method includes rotating a semiconductor wafer by a first rotating platen in a first cleaning stage. The method further includes providing a cleaning fluid to a surface of the semiconductor wafer. The method further includes controlling a vibrating device to provide the cleaning fluid with a first frequency while rotating the semiconductor wafer, so that particles on the semiconductor wafer are removed by the cleaning fluid. The method also includes disposing the semiconductor wafer at a second cleaning stage after controlling the vibrating device to provide the cleaning fluid with the first frequency. In addition, the method includes rotating the semiconductor wafer by a second rotating platen in the second cleaning stage while providing the cleaning fluid to the surface of the semiconductor wafer. Moreover, the method also includes controlling the vibrating device to provide the cleaning fluid with a second frequency while rotating the semiconductor wafer, so that particles on the semiconductor wafer are removed by the cleaning fluid, and the second frequency is greater than the first frequency.

In accordance with some embodiments, a post CMP cleaning method is provided. The method includes rotating a semiconductor wafer by a rotating mechanism in a first cleaning stage. The method further includes providing a cleaning solution to a surface of the semiconductor wafer. The method further includes providing a brush cleaner to scrub the surface of the semiconductor wafer, so that particles on the semiconductor wafer are removed. The method also includes disposing the semiconductor wafer at a second cleaning stage after providing the brush cleaner to scrub the surface of the semiconductor wafer. In addition, the method includes rotating the semiconductor wafer by a rotating platen in the second cleaning stage. Moreover, the method also includes providing a cleaning fluid to the surface of the semiconductor wafer. The method also includes controlling a vibrating device to provide the cleaning fluid with a second frequency while rotating the semiconductor wafer, so that particles on the semiconductor wafer are removed by the cleaning fluid.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A post CMP cleaning method, comprising:
    rotating a semiconductor wafer by a first rotating platen in a first cleaning stage;
    providing a cleaning fluid to a surface of the semiconductor wafer;
    controlling a vibrating device to provide the cleaning fluid with a first frequency while rotating the semiconductor wafer, so that particles on the semiconductor wafer are removed by the cleaning fluid;
    disposing the semiconductor wafer at a second cleaning stage after controlling the vibrating device to provide the cleaning fluid with the first frequency;
    rotating the semiconductor wafer by a second rotating platen in the second cleaning stage while providing the cleaning fluid to the surface of the semiconductor wafer; and
    controlling the vibrating device to provide the cleaning fluid with a second frequency while rotating the semiconductor wafer, so that particles on the semiconductor wafer are removed by the cleaning fluid, wherein the second frequency is greater than the first frequency;
    wherein the cleaning fluid is provided by a solution delivery module;
    wherein the solution delivery module has a long strip-shaped housing, the vibrating device has a long strip-shaped housing, when viewed in a direction perpendicular to the first rotating platen or the second rotating platen, the housing of the solution delivery module is disposed near the vibrating device so that a fan shaped area on the semiconductor wafer is defined by the housing of the solution delivery module, the housing of the vibrating device and periphery of the semiconductor wafer, the housing of the solution delivery module has a longitudinal axis, and the solution delivery module provides the cleaning fluid in a direction perpendicular to the longitudinal axis toward the fan shaped area;
    wherein an angle of the fan shape area is less than 90 degrees, the housing of the solution delivery module has a first side extending along the longitudinal axis of the solution delivery module, the housing of the vibrating device has a second side extending along a longitudinal axis of the vibrating device, and the fan shape area is defined by the first side, the second side and the periphery of the semiconductor wafer, wherein the first side is not in contact with the second side, the first side faces the second side, and the first side is not parallel to the second side;
    wherein when viewed in the direction perpendicular to the first rotating platen or the second rotating platen, the portion of the cleaning fluid just leaving the solution delivery module does not overlap the vibrating device;
    wherein when viewed in a direction parallel to the first rotating platen or the second rotating platen, the housing of the solution delivery module has a bottom surface parallel to the semiconductor wafer, and the cleaning fluid is provided from the bottom surface toward the semiconductor wafer.

2. The post CMP cleaning method as claimed in claim 1, further comprising:
  disposing the semiconductor wafer at a middle cleaning stage before disposing the semiconductor wafer at the second cleaning stage and after controlling the vibrating device to provide the cleaning fluid with the first frequency;
  rotating the semiconductor wafer by a middle rotating platen in the middle cleaning stage; and
  controlling the vibrating device to provide the cleaning fluid with a third frequency while rotating the semiconductor wafer, so that particles are removed by the cleaning fluid, wherein the second frequency is greater than the third frequency, and the third frequency is greater than the first frequency.

3. The post CMP cleaning method as claimed in claim 2, wherein the first frequency ranges from 0.1 Mhz to 10 Mhz, the third frequency ranges from 10 Mhz to 100 Mhz, and the second frequency is higher than 100 Mhz.

4. The post CMP cleaning method as claimed in claim 3, wherein the vibrating device includes three transducers respectively corresponding to the first frequency, the second frequency and the third frequency.

5. The post CMP cleaning method as claimed in claim 2, wherein the second frequency ranges from 1 GHz to 100 GHz.

6. The post CMP cleaning method as claimed in claim 2, wherein the semiconductor wafer is disposed on the first rotating platen in a first chamber during the first cleaning stage, and the semiconductor wafer is disposed on the second rotating platen in a second chamber during the second cleaning stage, and the first chamber is different from the second chamber.

7. The post CMP cleaning method as claimed in claim 1, wherein the vibrating device includes at least two transducers, and a controller is configured to control the vibrating device to generate a different frequency using a different transducer.

8. The post CMP cleaning method as claimed in claim 1, wherein a length of the long strip-shaped housing of the vibrating device is substantially equal to a radius of the semiconductor wafer.

9. The post CMP cleaning method as claimed in claim 1, wherein when viewed in the direction perpendicular to the first rotating platen or the second rotating platen, the semiconductor wafer has a radius which overlaps the solution delivery module, and a direction of a tangent speed corresponding to the radius is the same as the direction of the cleaning fluid.

10. A post CMP cleaning method, comprising:
  rotating a semiconductor wafer by a first rotating platen in a first cleaning stage;
  providing a cleaning fluid to a surface of the semiconductor wafer;
  providing the cleaning fluid with a first frequency while rotating the semiconductor wafer, so that particles on the semiconductor wafer are removed by the cleaning fluid;
  disposing the semiconductor wafer at a second cleaning stage after providing the cleaning fluid with the first frequency;
  rotating the semiconductor wafer by a second rotating platen in the second cleaning stage while providing the cleaning fluid to the surface of the semiconductor wafer; and
  providing the cleaning fluid with a second frequency while rotating the semiconductor wafer, so that particles on the semiconductor wafer are removed by the cleaning fluid, wherein the second frequency is greater than the first frequency;
  wherein a vibrating device is in contact with the cleaning fluid;
  wherein the cleaning fluid is provided by a solution delivery module;
  wherein the solution delivery module has a long strip-shaped housing, the vibrating device has a long strip-shaped housing, when viewed in a direction perpendicular to the first rotating platen or the second rotating platen, the housing of the solution delivery module is disposed near the vibrating device so that a fan shaped area on the semiconductor wafer is defined by the housing of the solution delivery module, the housing of the vibrating device and periphery of the semiconductor wafer, the housing of the solution delivery module has a longitudinal axis, and the solution delivery module provides the cleaning fluid in a direction perpendicular to the longitudinal axis toward the fan shaped area;
  wherein an angle of the fan shape area is less than 90 degrees, the housing of the solution delivery module has a first side extending along the longitudinal axis of the solution delivery module, the housing of the vibrating device has a second side extending along a longitudinal axis of the vibrating device, and the fan shape area is defined by the first side, the second side and the periphery of the semiconductor wafer, wherein the first side is not in contact with the second side, the first side faces the second side, and the first side is not parallel to the second side;
  wherein when viewed in the direction perpendicular to the first rotating platen or the second rotating platen, the portion of the cleaning fluid just leaving the solution delivery module does not overlap the vibrating device;
  wherein when viewed in a direction parallel to the first rotating platen or the second rotating platen, the housing of the solution delivery module has a bottom surface parallel to the semiconductor wafer, and the cleaning fluid is provided from the bottom surface toward the semiconductor wafer.

11. The post CMP cleaning method as claimed in claim 10, further comprising:
  disposing the semiconductor wafer at a middle cleaning stage before disposing the semiconductor wafer at the second cleaning stage and after providing the cleaning fluid with the first frequency;
  rotating the semiconductor wafer by a middle rotating platen in the middle cleaning stage; and
  providing the cleaning fluid with a third frequency while rotating the semiconductor wafer, so that particles is removed by the cleaning fluid, wherein the second frequency is greater than the third frequency, and the third frequency is greater than the first frequency.

12. The post CMP cleaning method as claimed in claim 11, wherein the vibrating device is in contact with the cleaning fluid to provide the cleaning fluid with the first frequency, the second frequency and the third frequency, and a distance is formed between the vibrating device and the semiconductor wafer.

13. The post CMP cleaning method as claimed in claim 12, wherein the first frequency ranges from 0.1 Mhz to 10 Mhz, the third frequency ranges from 10 Mhz to 100 Mhz, and the second frequency is higher than 100 Mhz.

14. The post CMP cleaning method as claimed in claim 13, wherein the vibrating device includes three transducers respectively corresponding to the first frequency, the second frequency and the third frequency.

15. The post CMP cleaning method as claimed in claim 12, wherein the vibrating device includes three transducers, and a controller is configured to control the vibrating device to generate a different frequency using a different transducer.

16. The post CMP cleaning method as claimed in claim 10, wherein when viewed in the direction perpendicular to the first rotating platen or the second rotating platen, the cleaning fluid is ejected from the bottom surface of the housing of the solution delivery module.

17. A post CMP cleaning method, comprising:
rotating a semiconductor wafer by a first rotating platen in a first cleaning stage;
providing a cleaning fluid to a surface of the semiconductor wafer;
controlling a vibrating device to provide the cleaning fluid with a first frequency while rotating the semiconductor wafer, so that particles on the semiconductor wafer are removed by the cleaning fluid, wherein a distance is formed between the vibrating device and the semiconductor wafer;
disposing the semiconductor wafer at a second cleaning stage after controlling the vibrating device to provide the cleaning fluid with the first frequency;
rotating the semiconductor wafer by a second rotating platen in the second cleaning stage while providing the cleaning fluid to the surface of the semiconductor wafer; and
controlling the vibrating device to provide the cleaning fluid with a second frequency while rotating the semiconductor wafer, so that particles on the semiconductor wafer are removed by the cleaning fluid, wherein the second frequency is greater than the first frequency;
wherein the cleaning fluid is provided by a solution delivery module;
wherein the solution delivery module has a long strip-shaped housing, the vibrating device has a long strip-shaped housing, when viewed in a direction perpendicular to the first rotating platen or the second rotating platen, the housing of the solution delivery module is disposed near the vibrating device so that a fan shaped area on the semiconductor wafer is defined by the housing of the solution delivery module, the housing of the vibrating device and periphery of the semiconductor wafer, the housing of the solution delivery module has a longitudinal axis, and the solution delivery module provides the cleaning fluid in a direction perpendicular to the longitudinal axis toward the fan shaped area;
wherein an angle of the fan shape area is less than 90 degrees, the housing of the solution delivery module has a first side extending along the longitudinal axis of the solution delivery module, the housing of the vibrating device has a second side extending along a longitudinal axis of the vibrating device, and the fan shape area is defined by the first side, the second side and the periphery of the semiconductor wafer, wherein the first side is not in contact with the second side, the first side faces the second side, and the first side is not parallel to the second side;
wherein when viewed in the direction perpendicular to the first rotating platen or the second rotating platen, the portion of the cleaning fluid just leaving the solution delivery module does not overlap the vibrating device;
wherein when viewed in a direction parallel to the first rotating platen or the second rotating platen, the housing of the solution delivery module has a bottom surface parallel to the semiconductor wafer, and the cleaning fluid is provided from the bottom surface toward the semiconductor wafer.

18. The post CMP cleaning method as claimed in claim 17, further comprising:
disposing the semiconductor wafer at a middle cleaning stage before disposing the semiconductor wafer at the second cleaning stage and after controlling the vibrating device to provide the cleaning fluid with the first frequency;
rotating the semiconductor wafer by a middle rotating platen in the middle cleaning stage; and
controlling the vibrating device to provide the cleaning fluid with a third frequency while rotating the semiconductor wafer, so that particles is removed by the cleaning fluid, wherein the second frequency is greater than the third frequency, and the third frequency is greater than the first frequency.

19. The post CMP cleaning method as claimed in claim 18, wherein a vibrating device is in contact with the cleaning fluid to provide the cleaning fluid with the first frequency, the second frequency and the third frequency.

20. The post CMP cleaning method as claimed in claim 17, wherein a space formed between the vibrating device and the semiconductor wafer is equal to or less than 1 cm.

* * * * *